(12) United States Patent
Chao et al.

(10) Patent No.: US 7,420,267 B2
(45) Date of Patent: Sep. 2, 2008

(54) IMAGE SENSOR ASSEMBLY AND METHOD FOR FABRICATING THE SAME

(75) Inventors: Yeong-Ching Chao, Tainan (TW); An-Hong Liu, Tainan (TW); Yao-Jung Lee, Tainan (TW)

(73) Assignees: ChipMOS Technologies (Bermuda) Ltd., Hamilton (BE); ChipMOS Technologies Inc., Hsinchu (TW)

( * ) Notice: Subject to any disclaimer, the term of this patent is extended or adjusted under 35 U.S.C. 154(b) by 231 days.

(21) Appl. No.: 11/254,677

(22) Filed: Oct. 21, 2005

(65) Prior Publication Data

US 2006/0087022 A1    Apr. 27, 2006

(30) Foreign Application Priority Data

Oct. 21, 2004    (TW) .............................. 93132005 A (51) Int. Cl.
*H01L 23/02*    (2006.01)
(52) U.S. Cl. ................ 257/678; 257/737; 257/E23.001
(58) Field of Classification Search ................ 257/678, 257/680, 686, 778, 772, 779, 737, 704, 666, 257/E23.001, E23.021, E23.031, E23.194
See application file for complete search history.

(56) References Cited

U.S. PATENT DOCUMENTS 6,730,855 B2 *    5/2004    Bando .................... 174/254
6,964,886 B2 *    11/2005    Kinsman .................... 438/125
2005/0167817 A1 *    8/2005    Damberg .................... 257/698

FOREIGN PATENT DOCUMENTS

| TW | 459355 | 10/2001 |
| TW | 484237 | 4/2002 |

* cited by examiner

*Primary Examiner*—Howard Weiss
*Assistant Examiner*—Hoa B Trinh
(74) *Attorney, Agent, or Firm*—Troxell Law Office, PLLC (57) ABSTRACT

An assembly device of an image sensor chip is disclosed. A flexible circuit has a die-attached portion, a plurality of bendable portions, and a plurality of bonding portions where the bendable portions extend from the die-attached portion and are connected to the corresponding bonding portions. A plurality of inner leads are formed on the bonding portions. An image sensor chip with bumps is attached to the die-attached portion. The bendable portions are so bent that the bonding portions are located above the image sensor chip. By thermo-compression bonding, the inner leads of the flexible circuit are bonded to the bumps on the image sensor chip. In one embodiment, a transparent cover is adhered to the bonding portions and located above a sensing area of the image sensor chip.

7 Claims, 7 Drawing Sheets

IMAGE SENSOR ASSEMBLY AND METHOD FOR FABRICATING THE SAME

FIELD OF THE INVENTION

The present invention relates to an assembly device of an image sensor chip and its fabricating method, and more particularly, to an assembly device of an image sensor chip using flexible circuit to replace the conventional rigid substrate and the encapsulant.

BACKGROUND OF THE INVENTION

Image sensor chips have been widely implemented in everyday lives such as cellular phones, personal digital assistants (PDA), digital still cameras (DSC), digital video cameras (DV), video phones, video conferences, and so on. It is necessary to packaging image sensor chips prior to surface-mounting. A disclosed image sensor package and its packaging method are revealed in R.O.C. Taiwan patent publication No. 459,355. An image sensor chip is flip-chip bonded to a glass substrate. A plurality of signal input terminals and a plurality of signal output terminals, which are formed on the different surfaces of the glass substrate, are electrically connected to each other by traces on surfaces and sides of the glass substrate. The signal input terminals are electrically connected to the image sensor chip and the signal output terminals to a printed circuit board having an opening. Therefore, the electrical transmission path is from the image sensor chip through the glass substrate to the printed circuit board so that the glass substrate possesses two basic criteria, good optical transparency and double-side electrical transmission. However, it is very difficult to fabricate traces on double layers and sides of the glass substrate. Accordingly, the fabrication cost of the glass substrate is very high. Moreover, the image sensor chip is lack of protection.

Furthermore, another known image sensor chip is revealed in R.O.C. Taiwan patent publication No. 484,237, entitled "An optical device with a tape packaging type". An image sensor package with TCP type includes an image sensor chip, a flexible circuit board, and an encapsulant where the flexible circuit board has a plurality of inner leads and a device hole. The encapsulant accommodates the image sensor chip and has a cavity aligned with the device hole of the flexible circuit board and a sensing area of the image sensor chip. In order to avoid the image sensor chip from the damages of moisture or dusts, a transparent cover is needed to adhere to the sidewall around the cavity. However, the encapsulant is made by molding and its thickness is much greater than the thickness of the flexible circuit board. The sensing area of the image sensor chip is easily contaminated during molding the encapsulant and the total thickness of the image sensor package cannot be reduced.

SUMMARY OF THE INVENTION

The main purpose of the present invention is to provide an assembly device and an assembling method for an image sensor chip using a bent flexible circuit to protect the sides of the image sensor chip. The flexible circuit has a plurality of bendable portions extending from a die-attached portion and connecting to a plurality of bonding portions. The bendable portions are bent to locate around the sides of the image sensor chip, the bonding portions are located above the image sensor chip. A plurality of inner leads formed on the bonding portions are bonded to the bumps on the image sensor chip. The bent bendable portions can protect the image sensor chip to replace the conventional encapsulant and reduce the overall package thickness.

According to the present invention, an image sensor assembly mainly comprises a flexible circuit and an image sensor chip having bumps. The flexible circuit has a die-attached portion, a plurality of bendable portions, and a plurality of bonding portions where the bendable portions are extended from the die-attached portion and are connected to the bonding portions respectively. A plurality of inner leads are formed on the bonding portions. An image sensor chip is attached to the die-attached portion of the flexible circuit where the image sensor chip has a sensing area where the bumps are formed around the sensing area on the image sensor chip. The bendable portions are so bent that the bonding portions are located above the image sensor chip and the bendable portions are located around sides of the image sensor chip. Thereby, the inner leads of the bonding portions can be bonded to the bumps on the image sensor chip. Preferably, a transparent cover is adhered to the bonding portions corresponding to the sensing area of the image sensor chip to prevent moisture or dusts contaminating the sensing area. A plurality of solder balls may be placed on the flexible circuit.

DETAIL DESCRIPTION OF THE INVENTION

Please refer to the attached drawings, the present invention will be described by means of embodiments below.

Figure 1:
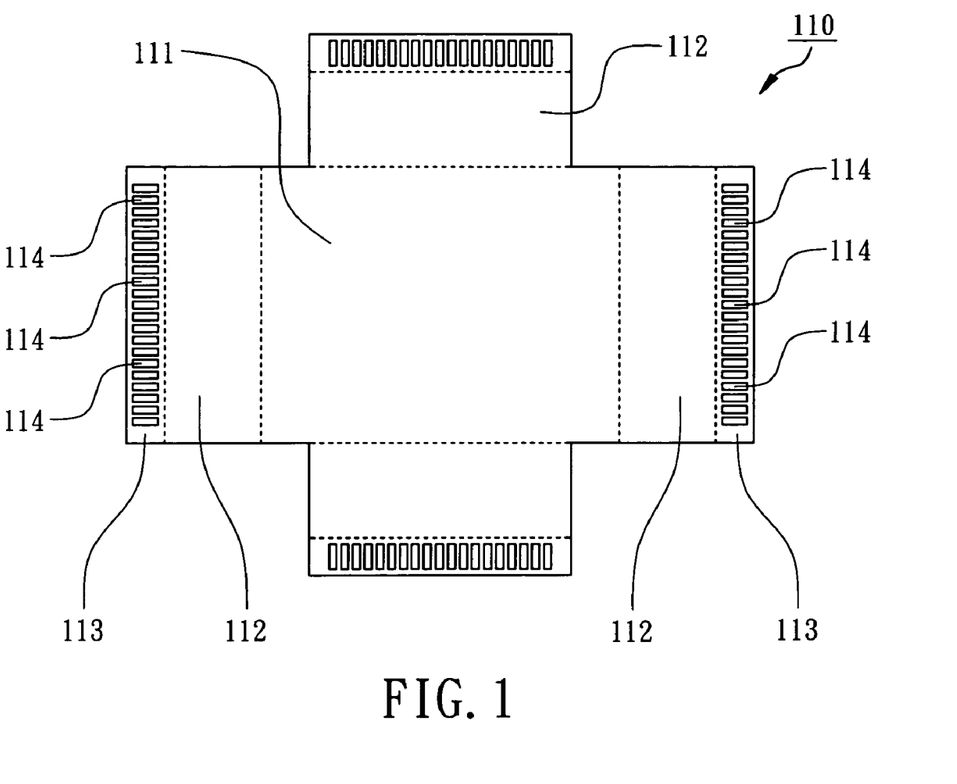
FIG. 1 is a top view of a flexible circuit for an image sensor assembly according to the first embodiment of the present invention.
Figure 2A:
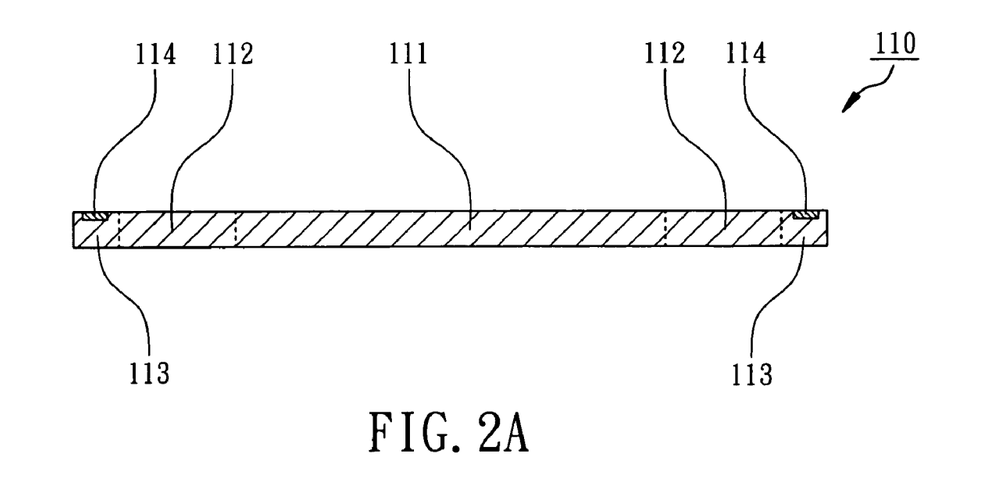
FIG. 2A to 2F are cross-sectional views of the flexible circuit during assembling processes according to the first embodiment of the present invention.
Figure 2B:
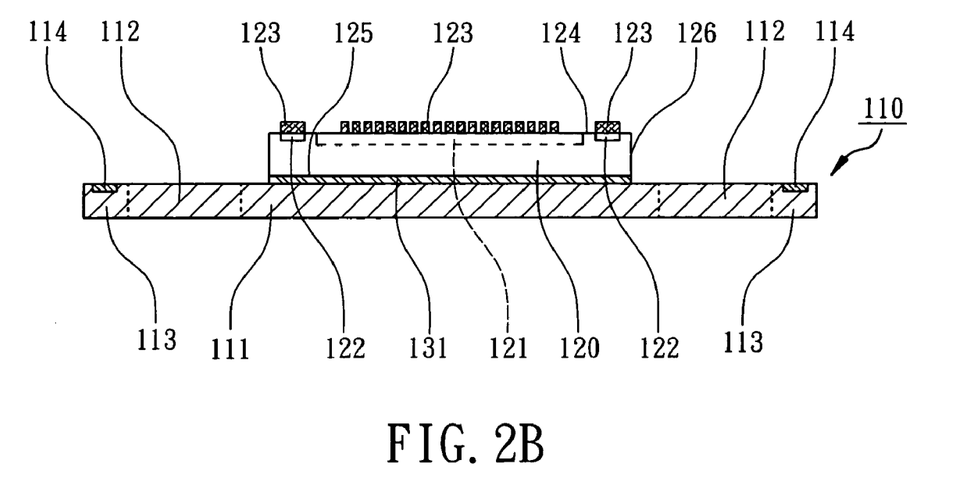
Figure 2C:
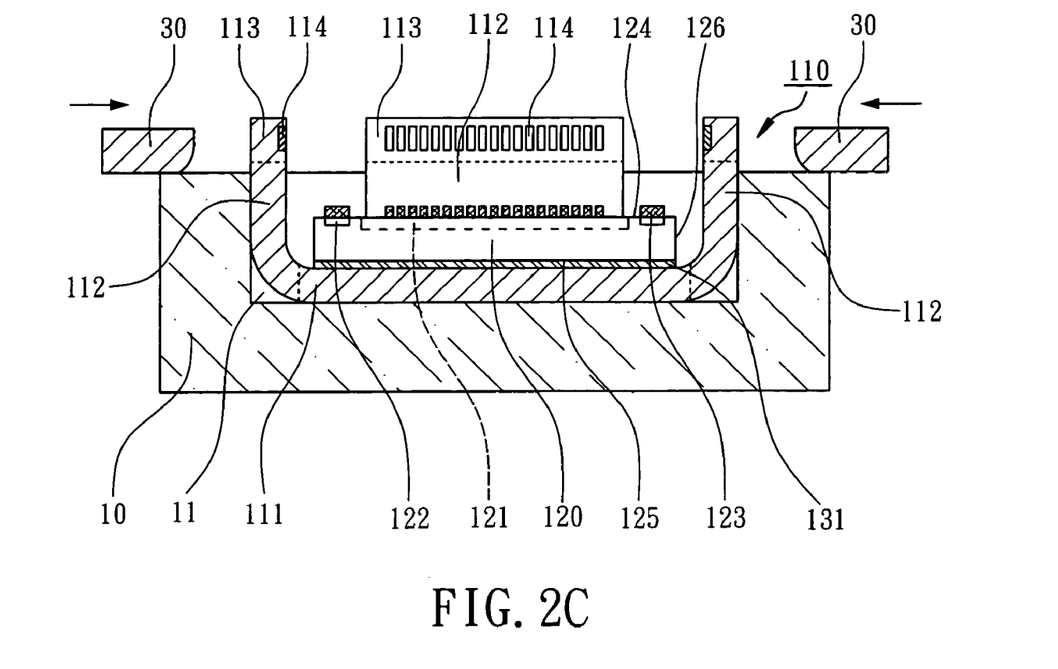
Figure 2D:
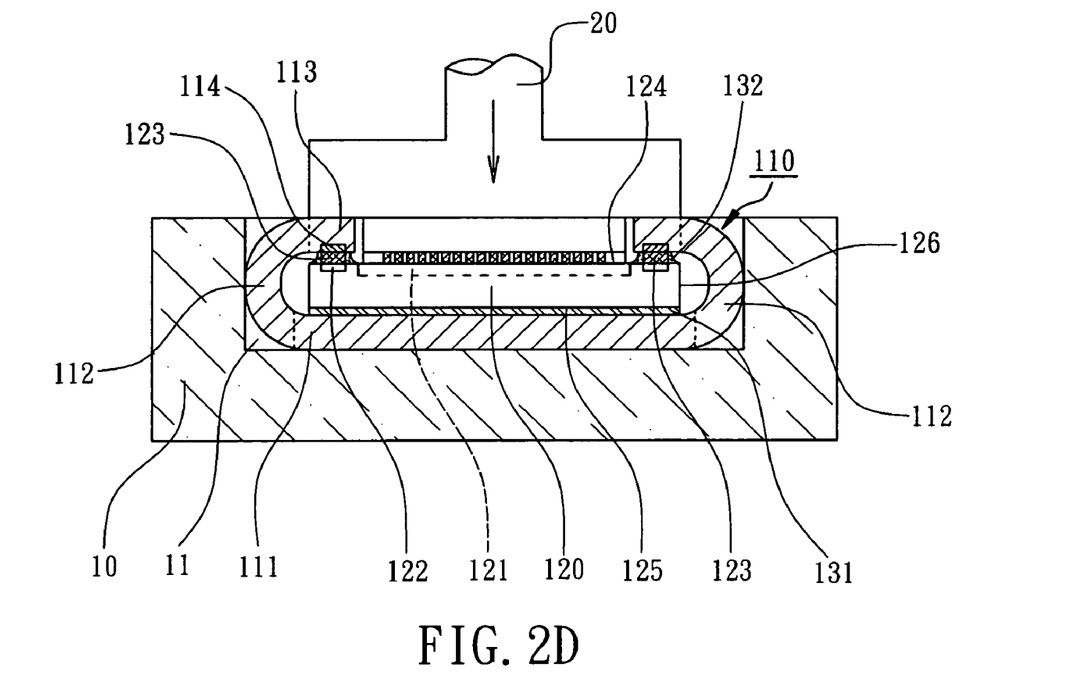
Figure 2E:
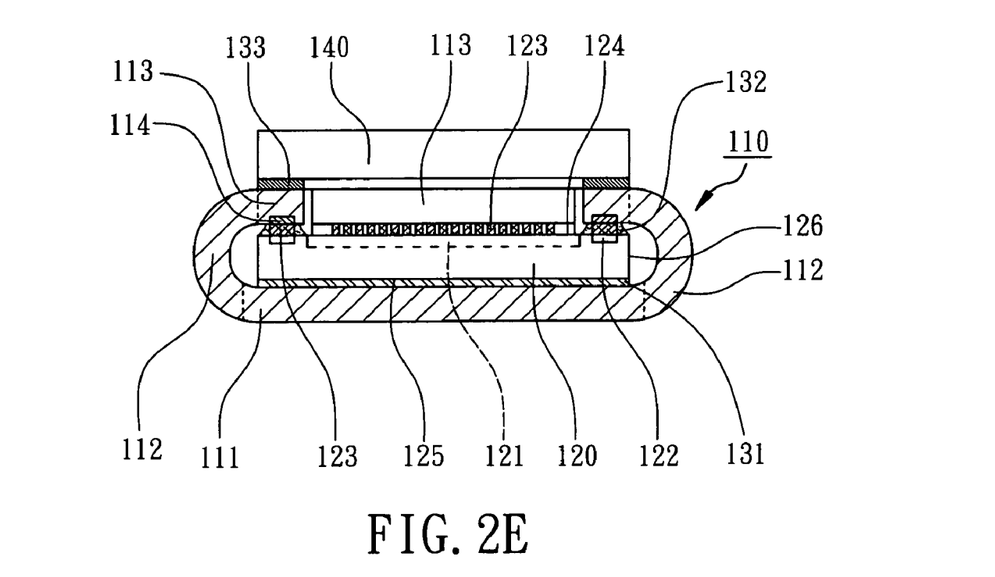
Figure 2F:
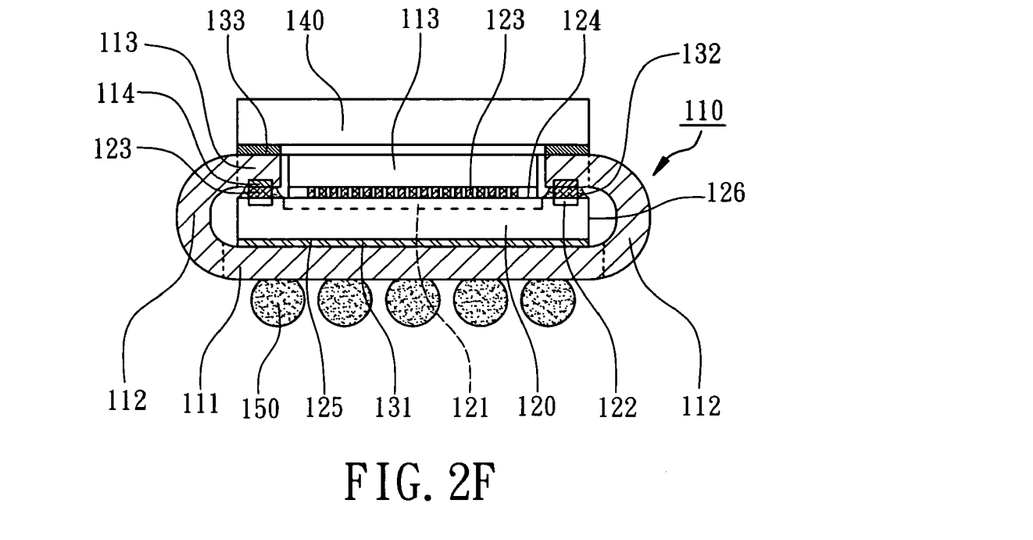

According to the first embodiment of the present invention, FIG. 1 shows a flexible circuit for an image sensor assembly, FIG. 2A to 2F show the flexible circuit during assembling processes, especially FIG. 2F shows the cross-sectional view of the image sensor assembly. The image sensor assembly mainly comprises a flexible circuit 110 and an image sensor chip 120. As shown in FIGS. 1 and 2A, the flexible circuit 110 has a die-attached portion 111, a plurality of bendable portions 112 and a plurality of bonding portions 113 where the bendable portions 112 are extended from the die-attached portion 111 and are connected to the bonding portions 113 respectively. The flexible circuit 110 which is made of a polyimide (PI) film with a thickness not greater than 0.2 mm and has at least a wiring layer. A plurality of inner leads 114 are formed on the bonding portions 113 where the inner leads 114 are made of copper metal foil, preferably, a nickel/gold layer is disposed on the inner leads 114 (not shown in the figures).

As shown in FIG. 2B, an image sensor chip 120 is attached to the die-attached portion 111 of the flexible circuit 110 by an adhesive layer 131. The image sensor chip 120 has an active surface 124 including a sensing area 121, an opposing back surface 125, and a plurality of sides 126 between the active surface 124 and the back surface 125. A plurality of bonding pads 122 are formed on the active surface 124 around the sensing area 121. In this embodiment, the image sensor chip 120 is a Complementary Metal Oxide Semiconductor (CMOS) chip where a plurality of pixels and sensing components are formed in the sensing area 121. A plurality of bumps 123 are disposed on the bonding pads 122 where the bumps 123 may be gold bumps, solder bumps, or polymer conductive bumps. The adhesive layer 131 adheres to the back surface 125.

As shown in FIG. 2C, a tool 10 with a cavity 11 is provided for the assembling processes of the image sensor assembly according to the first embodiment of the present invention. The die-attached portion 111 and the attached image sensor chip 120 are disposed in the cavity 11 of the tooling 10. By the tool 10, the bendable portions 112 of the flexible circuit 110 are bent upwards to located around the sides 126. By moving a plurality of pushing boards 30 on the tool 10, the bendable portions 112 are so bent that the bonding portions 113 located above the active surface 124 of the image sensor chip 120 (as shown in FIG. 2D).

Referring to FIG. 2D, a thermocompression head 20 moves downwards to push the bonding portions 113. Then, the inner leads 114 of the bonding portions 113 are bonded to the corresponding bumps 123 to achieve electrical connections between the flexible circuit 110 and the image sensor chip 120. Moreover, the sides 126 of the image sensor chip 120 are protected by the bendable portions 112. The thermocompression bonding between the inner leads 114 and the bumps 123 may be metal-soldering, eutectic bonding, antisotropic conductive bonding by ACF or ACP, or contact connection by NCP or NCF. In this first embodiment, an annular sealant 132 selected from non-flow underfill material, ACF, ACP, NCF, or NCP, is disposed on peripheries of the active surface 124 without contaminating the sensing area 121 for hermetically sealing the sensing area 121 after adhering a transparent cover 140.

As shown in FIG. 2E, the transparent cover 140 is adhered to the bonding portions 113 of the flexible circuit 110 by an adhesive 133 on the bonding portions 113. Thereby, the sensing area 121 of the image sensor chip 120 is hermetically sealed and is free from contamination of moisture or dusts. The transparent cover 140 may be an optical glass and is aligned with the sensing area 121 of the image sensor chip 120.

Preferably, as shown in FIG. 2F, a plurality of solder balls 150 are placed on the bottom surface of the die-attached portion 111 of the flexible circuit 110 and electrically connected to the inner leads 114 as the external electrical connections of the image sensor assembly.

Since the bendable portions 112 bent around the sides 126 of the image sensor chip 120, the die-attached portion 111 and the bent bendable portions 112 can protect the image sensor chip 120 without conventional encapsulants nor rigid substrates. In this embodiment, the bendable portions 112 are elastic without contacting with the sides 126 of the image sensor chip 120 to provide a better protection as collision shock absorbers. In addition, the overall thickness of the image sensor assembly is thin.

Figure 3:
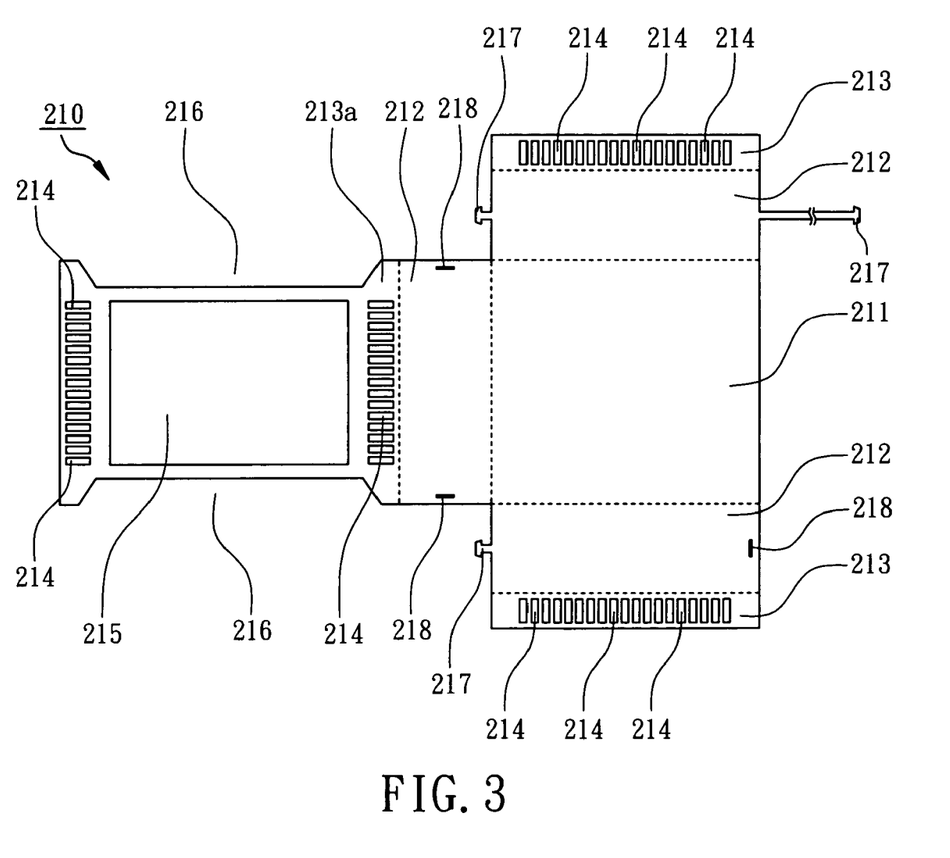
FIG. 3 is a top view of a flexible circuit for an image sensor assembly according to the second embodiment of the present invention.
Figure 4A:
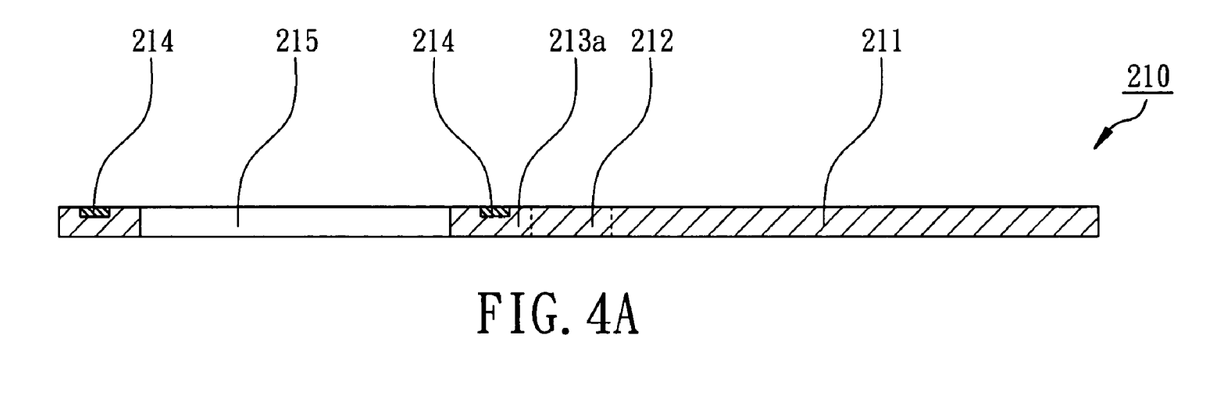
FIG. 4A to 4E are cross-sectional views of the flexible circuit during assembling processes according to the second embodiment of the present invention.
Figure 4B:
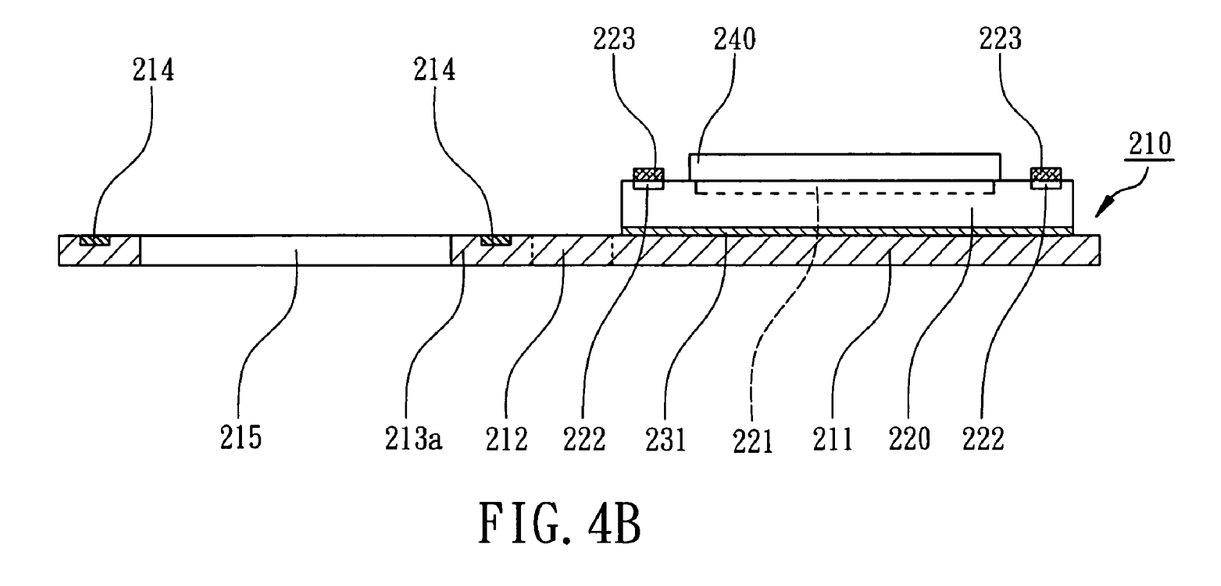
Figure 4C:
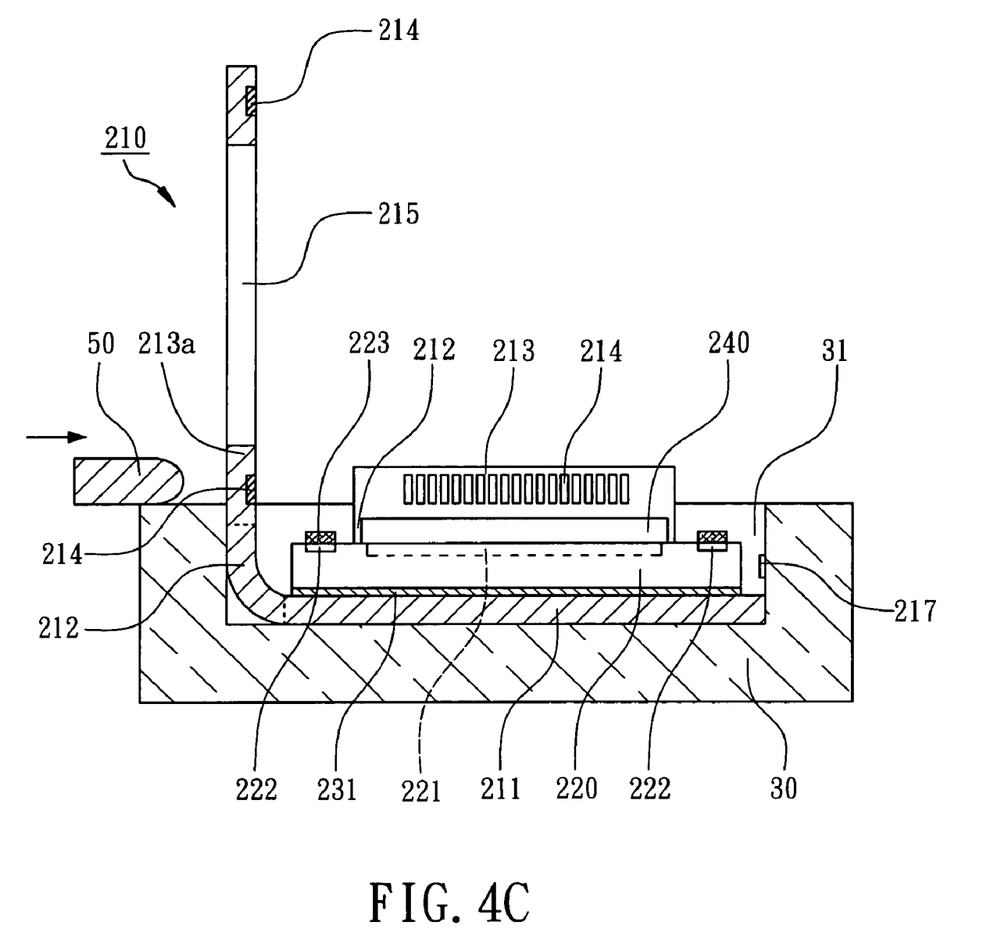
Figure 4D:
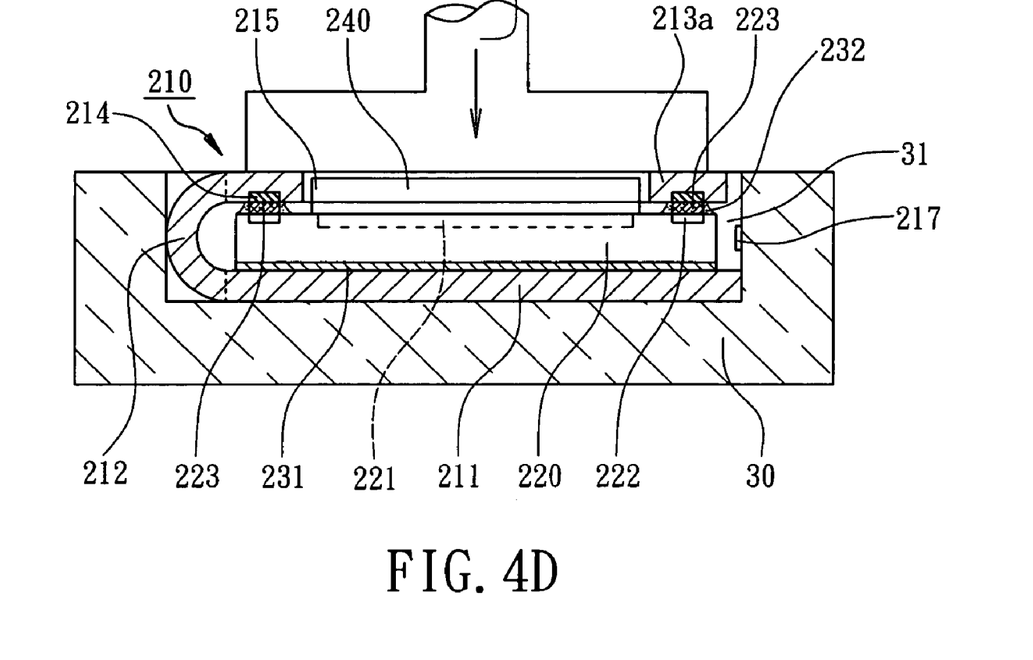
Figure 4E:
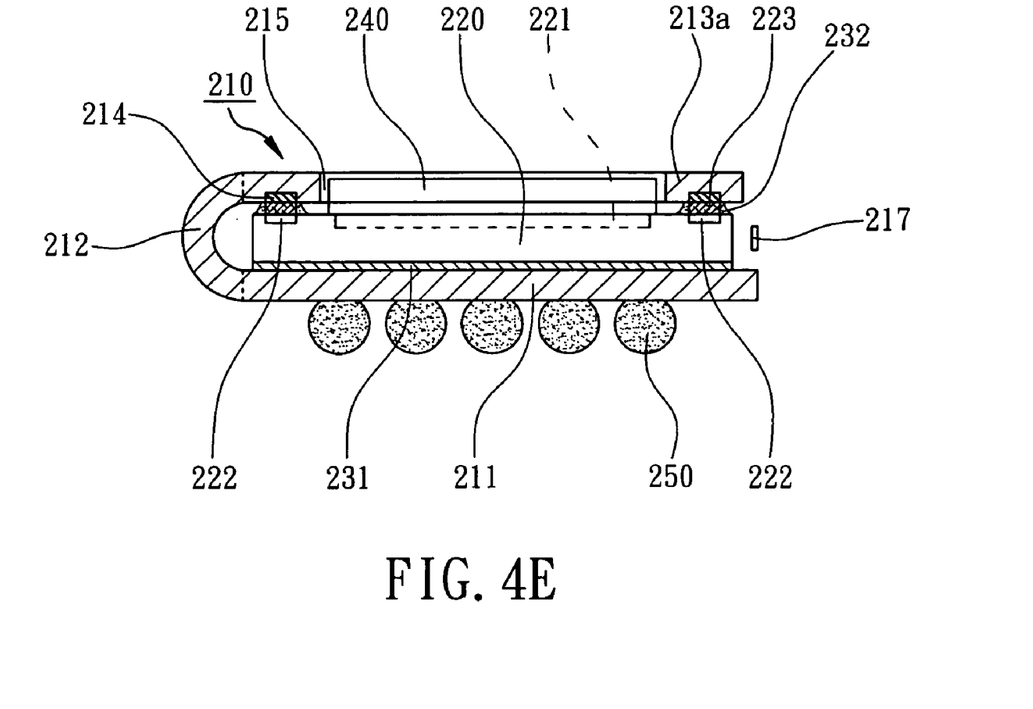

According to the second embodiment of the present invention, FIG. 3 shows another flexible circuit for an image sensor assembly, FIG. 4A to 4E show the flexible circuit during assembling processes, especially FIG. 4E shows the cross-sectional view of the image sensor assembly. The image sensor assembly mainly comprises a flexible circuit 210 and an image sensor chip 220. As shown in FIGS. 3 and 4A, the flexible circuit 210 has a die-attached portion 211, a plurality of bendable portions 212, and a plurality of bonding portions 213 where the bendable portions 212 are extended from the die-attached portion 211 and are connected to the bonding portions 213. A plurality of inner leads 214 are formed on the bonding portions 213. One bonding portion 213a of the bonding portions 213 has an opening 215. The opening 215 is aligned with a sensing area 221 of the image sensor chip 220 after thermocompression bonding the bonding portions 213 to the image sensor chip 220 (as shown in FIG. 4E). In this embodiment, referring to FIG. 3 again, one bonding portions 213a of the bonding portions 213 having the opening 215 further has a plurality of depressions 216 for locating another bonding portions 213 above the image sensor chip 220. Preferably, the flexible circuit 210 has an inserting piece 217 extending from one of the bendable portions 212 and a fixing slot 218 in one of the adjacent bendable portions 212 for receiving the inserting piece 217 for a better positioning.

As shown in FIG. 4B, an image sensor chip 220 is attached to the die-attached portion 211 of the flexible circuit 210 by an adhesive layer 231 between the back surface of the image sensor chip 220 and the die-attached portion 211. The image sensor chip 220 has a sensing area 221 and a plurality of bonding pads 222 around the sensing area 221. A plurality of bumps 223 are disposed on the bonding pads 222. In this embodiment, a transparent cover 240 is disposed on the active surface of the image sensor chip 220.

According to the assembling processes in the second embodiment, a tool 30 with a cavity 31 is provided as shown in FIG. 4C. The die-attached portion 211 and the attached image sensor chip 220 are disposed in the cavity 31 of the tooling 30 to bend the bendable portions 212 of the flexible circuit 210 upwards, and then a pushing board 50 on the tool 30 pushes and bends the flexible circuit 210. The bendable portions 212 will be re-bent so that the bonding portions 213 located above the image sensor chip 220 (as shown in FIG. 4D). As shown in FIG. 4D, a thermocompression head 40 moves downwards to bond the inner leads 214 of the bonding portions 213 and 213a to the corresponding bumps 223 on the image sensor chip 120. In the second embodiment, an annular adhesive 232 is disposed around the sensing area 221 to fix the bonding portions 213. By bending the bendable portions 212, the bonding portions 213 and 213a of the flexible circuit 210 are located above the active surface of the image sensor chip 220, the bendable portions 212 are located around the sides of the image sensor chips 220, and the opening 215 of the bonding portion 213a is aligned with the sensing area 221 of the image sensor chip 220. When thermocompression bonding using the thermocompression head 40, the inner leads 214 of the bonding portions 213 and 213a are electrically connected to the corresponding bumps 223 on the image sensor chip 220. As shown in FIG. 4E, a plurality of solder balls 250 may be placed on the bottom of the die-attached portion 211 of the flexible circuit 210 as the external electrical connections for the image sensor chip 220.

The above description of embodiments of this invention is intended to be illustrative and not limiting. Other embodiments of this invention will be obvious to those skilled in the art in view of the above disclosure.

What is claimed is:

1. An image sensor assembly comprising:
    a flexible circuit having a die-attached portion, a plurality of bendable portions, and a plurality of bonding portions, wherein the bendable portions are extended from the die-attached portion and are connected to the corresponding bonding portions, a plurality of inner leads are formed on the bonding portions; and
    an image sensor chip disposed on the die-attached portion, the image sensor chip having an active surface including a sensing area, a back surface, and a plurality of sides between the active surface and the back surface, and having a plurality of bumps on the active surface, wherein the back surface is attached to the die-attached portion;

wherein the bendable portions are so bent that the bonding portions are located above the active surface;

wherein the inner leads are bonded to the bumps, wherein the flexible circuit has an inserting piece extending from one of the bendable portions and a fixing slot in one of the adjacent bendable portions for receiving the inserting piece.

2. The image sensor assembly of claim 1, further comprising a transparent cover adhered to the bonding portions and located above the active surface.

3. The image sensor assembly of claim 2, further comprising an annular sealant disposed between the image sensor chip and the bonding portions to hermetically sealing the sensing area.

4. The image sensor assembly of claim 1, further comprising a plurality of solder balls placed on the flexible circuit.

5. The image sensor assembly of claim 1, wherein one of the bonding portions has an opening aligned with the sensing area.

6. The image sensor assembly of claim 5, wherein the bonding portion having the opening further has at least a depression.

7. The image sensor assembly of claim 1, wherein the bendable portions are elastic without contacting the sides of the image sensor chip.

* * * * *